US011955436B2

(12) United States Patent
Yong et al.

(10) Patent No.: US 11,955,436 B2
(45) Date of Patent: Apr. 9, 2024

(54) SELF-EQUALIZED AND SELF-CROSSTALK-COMPENSATED 3D TRANSMISSION LINE ARCHITECTURE WITH ARRAY OF PERIODIC BUMPS FOR HIGH-SPEED SINGLE-ENDED SIGNAL TRANSMISSION

(71) Applicant: Intel Corporation, Santa Clara, CA (US)

(72) Inventors: Khang Choong Yong, Puchong (MY); Ying Ern Ho, Bayan Lepas (MY); Yun Rou Lim, Bayan Lepas (MY); Wil Choon Song, Bayan Lepas (MY); Stephen Hall, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 963 days.

(21) Appl. No.: 16/393,304

(22) Filed: Apr. 24, 2019

(65) Prior Publication Data
US 2020/0343194 A1 Oct. 29, 2020

(51) Int. Cl.
*H01L 23/552* (2006.01)
*H01L 23/00* (2006.01)
(Continued)

(52) U.S. Cl.
CPC ............ *H01L 23/552* (2013.01); *H01L 23/66* (2013.01); *H01L 24/17* (2013.01); *H05K 1/0216* (2013.01);
(Continued)

(58) Field of Classification Search
CPC .............. H01L 23/58–66; H01L 23/528–5286
See application file for complete search history.

(56) References Cited

U.S. PATENT DOCUMENTS

| 7,659,791 B2 * | 2/2010 | Park | ..................... H05K 1/0219 333/246 |
| 7,705,690 B2 * | 4/2010 | Lee | ........................ H01P 3/081 333/246 |

(Continued)

FOREIGN PATENT DOCUMENTS

WO    WO 2013/101127    7/2013

OTHER PUBLICATIONS

Search Report from European Patent Application No. 20163316.1, dated Sep. 23, 2020, 8 pgs.
(Continued)

*Primary Examiner* — Victoria K. Hall
(74) *Attorney, Agent, or Firm* — Schwabe, Williamson & Wyatt, P.C.

(57) ABSTRACT

Embodiments include package substrates and method of forming the package substrates. A package substrate includes a dielectric over a conductive layer, and a conductive line on the dielectric. The package substrate includes a plurality of conductive bumps on a surface of the conductive line, where the conductive bumps are conductively coupled to the conductive line, and a solder resist over the conductive line and the dielectric. The surface of the conductive line may be a bottom surface, where the conductive bumps are below the conductive line and conductively coupled to the bottom surface of the conductive line, and where the conductive bumps may be embedded in the dielectric. The surface of the conductive line may be a top surface, where the conductive bumps are above the conductive line and conductively coupled to the top surface of the conductive line, and wherein the conductive bumps are embedded in the solder resist.

17 Claims, 9 Drawing Sheets

(51) Int. Cl.
*H01L 23/66* (2006.01)
*H05K 1/02* (2006.01)

(52) U.S. Cl.
CPC ...... *H05K 1/025* (2013.01); *H01L 2223/6627* (2013.01)

(56) References Cited

U.S. PATENT DOCUMENTS

| | | | | |
|---|---|---|---|---|
| 8,159,310 B2* | 4/2012 | Park | ................ | H01P 3/081 |
| | | | | 333/33 |
| 9,240,621 B2* | 1/2016 | Abbott | ................ | H01P 3/081 |
| 9,386,690 B2* | 7/2016 | Ding | ................ | H01P 3/026 |
| 9,742,464 B2* | 8/2017 | Mutnury | ................ | H01P 3/081 |
| 9,972,589 B1* | 5/2018 | Goh | ................ | H01L 23/528 |
| 10,076,024 B2* | 9/2018 | Ding | ................ | H01P 3/04 |
| 10,090,574 B2* | 10/2018 | Wu | ................ | H01P 3/08 |
| 10,117,325 B2* | 10/2018 | Kim | ................ | H05K 1/0237 |
| 10,149,377 B2* | 12/2018 | Huang | ................ | H01L 23/49827 |
| 10,211,497 B1* | 2/2019 | Hester | ................ | H01P 1/203 |
| 10,499,492 B2* | 12/2019 | Chandra | ................ | H04L 25/0278 |
| 11,369,020 B2* | 6/2022 | Huang | ................ | H03H 7/38 |
| 2004/0222528 A1* | 11/2004 | Kunikiyo | ................ | H01L 23/5283 |
| | | | | 257/E23.152 |
| 2005/0170691 A1* | 8/2005 | Mobley | ................ | H05K 1/0242 |
| | | | | 439/540.1 |
| 2006/0146484 A1* | 7/2006 | Kim | ................ | H05K 1/0219 |
| | | | | 361/600 |
| 2007/0236303 A1* | 10/2007 | Lee | ................ | H01P 3/081 |
| | | | | 333/1 |
| 2008/0053694 A1* | 3/2008 | Park | ................ | H05K 1/0219 |
| | | | | 174/350 |
| 2010/0171574 A1* | 7/2010 | Sakiyama | ................ | H01P 3/081 |
| | | | | 333/246 |
| 2010/0207700 A1* | 8/2010 | Park | ................ | H05K 1/0237 |
| | | | | 333/1 |
| 2010/0327989 A1* | 12/2010 | Abbott | ................ | H03H 7/38 |
| | | | | 716/100 |
| 2011/0030997 A1* | 2/2011 | Hsu | ................ | H05K 1/0245 |
| | | | | 174/254 |
| 2011/0090028 A1* | 4/2011 | Park | ................ | H01P 3/081 |
| | | | | 333/238 |
| 2012/0133454 A1* | 5/2012 | Wu | ................ | H01P 3/08 |
| | | | | 333/33 |
| 2014/0177150 A1* | 6/2014 | Oluwafemi | ................ | H05K 1/0228 |
| | | | | 361/679.02 |
| 2015/0236394 A1* | 8/2015 | Wu | ................ | H01P 3/081 |
| | | | | 333/238 |
| 2015/0280778 A1* | 10/2015 | Ding | ................ | H05K 3/10 |
| | | | | 29/846 |
| 2016/0094272 A1* | 3/2016 | Ye | ................ | H04B 3/32 |
| | | | | 375/257 |
| 2016/0148866 A1* | 5/2016 | Yong | ................ | H01L 21/2885 |
| | | | | 438/618 |
| 2017/0019145 A1* | 1/2017 | Mutnury | ................ | H01P 3/08 |
| 2017/0033425 A1* | 2/2017 | Ding | ................ | H04B 3/32 |
| 2017/0062893 A1* | 3/2017 | Wu | ................ | H01P 3/081 |
| 2017/0093007 A1* | 3/2017 | Elsherbini | ................ | H01P 3/088 |
| 2017/0374734 A1* | 12/2017 | Huang | ................ | H05K 1/0298 |
| 2018/0286797 A1* | 10/2018 | Goh | ................ | H01L 21/486 |
| 2018/0350748 A1* | 12/2018 | Cheah | ................ | H01L 25/0655 |
| 2019/0013557 A1* | 1/2019 | Wu | ................ | H01P 1/2039 |
| 2019/0069392 A1* | 2/2019 | Huang | ................ | H05K 1/0245 |
| 2019/0239339 A1* | 8/2019 | Chandra | ................ | H04B 3/32 |
| 2019/0326983 A1* | 10/2019 | Wang | ................ | H04L 1/00 |
| 2019/0335579 A1* | 10/2019 | Wyland | ................ | H05K 1/116 |

OTHER PUBLICATIONS

Office Action from European Patent Application No. 20163316.1, dated Jun. 7, 2022, 3 pgs.

\* cited by examiner

SELF-EQUALIZED AND SELF-CROSSTALK-COMPENSATED 3D TRANSMISSION LINE ARCHITECTURE WITH ARRAY OF PERIODIC BUMPS FOR HIGH-SPEED SINGLE-ENDED SIGNAL TRANSMISSION

FIELD

Embodiments relate to packaging electronic devices. More particularly, the embodiments relate to electronic devices with three-dimensional transmission lines with array of periodic bumps for enabling high-speed single-ended signal transmissions.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as high-speed single-ended interconnects/buses, while optimizing the performance of each device, however is not without issue.

Transmission line loss and crosstalk noise coupling are typically the main factors limiting the performance scaling of high-speed single-ended interconnects, such as on-package input/output (I/O) (OPIO) and memory I/O. This problem will continue to become even-more challenging on future semiconductor platforms as system performance scales-down, bus speeds increase, and form factors shrink. For example, the main limitations of high-speed single-ended buses can subsequently bottleneck system form-factor miniaturization, compromise system performances, complicate system designs, and lead to product recalls for future systems due to platform level functional failures.

One existing solution to address the bandwidth-limited transmission line (TUNE) due to loss/intersymbol interference (ISI) and crosstalk includes an on-die active crosstalk cancellation circuitry, however this circuitry is not feasible for the ever-growing low-power applications. Another solution is implementing signal conditioners with fixed/adaptive equalization, yet these signal conditioners substantially increase bill of materials (BOM) and board design complexity. Other existing solutions include a transmitter design with de-emphasis or/and pre-emphasis, but this solution is not feasible due to the increased physical layer (PHY) design complexity and the heightened power requirement. Lastly, another solution further includes a transmitter design with higher drive strength, however the design can cause reliability issues due to excessive signal overshoot/undershoot when the TLINE is overdriven.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
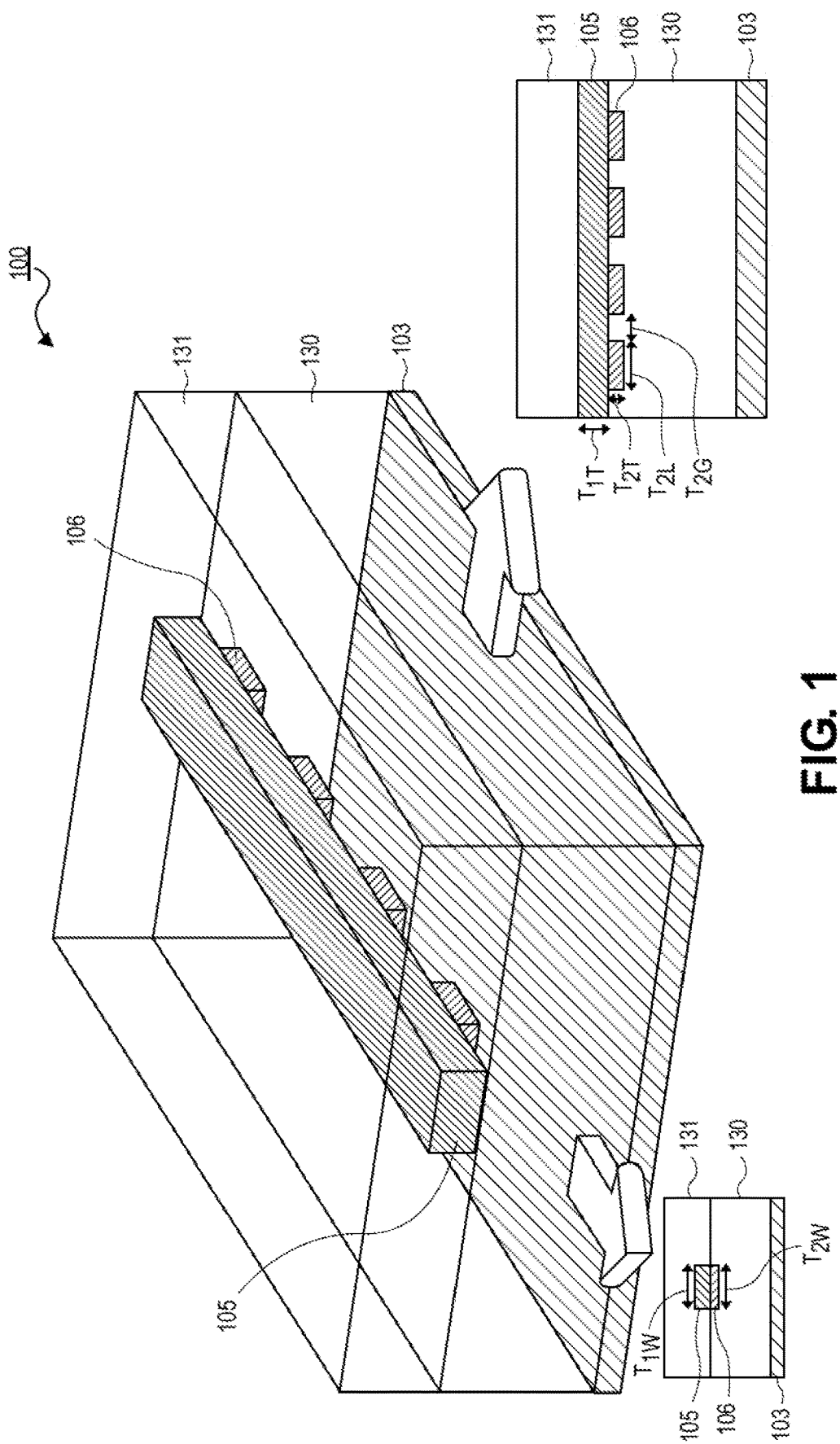
FIG. 1 is an illustration of a perspective view of a package substrate with a transmission line (TUNE) having an array of periodic bumps (APB) below the TLINE, according to one embodiment.

Described herein are electronic packages with three-dimensional (3D) transmission lines with array of periodic bumps (APBs) that enable high-speed single-ended signal transmissions and methods of forming such electronic packages. The electronic packages (e.g., semiconductor packages such as printed circuit boards (PCBs)) described below and methods of forming such electronic packages include a package substrate with a transmission line (TLINE) having one or more APBs below and/or above the TLINE, according to some embodiments.

As described herein, an "array of periodic bumps" (APB) refers to a plurality of conductive bumps disposed on a top surface and/or a bottom surface of a conductive transmission line (or a TLINE). Additionally, the APB may be formed of one or more metals such as copper, gold, or the like. The APB may have the same or different metal conductivity as the TLINE. For example, the metal conductivity of the APB may be selected based on the optimum skin-depth that corresponds to the equalization frequency range. In some embodiments, the APBs may be formed with one or more shapes in various orientations. The shapes of the APBs may include, but are not limited to, rectangles, squares, circles, diamonds, and polygons. Furthermore, as described below in further detail, the effectiveness of the APB, including the intersymbol interference (ISI) and crosstalk properties, may be improved based on the selected area/volume of the APB.

Accordingly, embodiments described herein include improvements of on-package electrical solutions by utilizing the transmission line skin-effect, and the transmission and self-coupling principles to transform the transmission line architecture to inherit the self-equalized and crosstalk-compensated properties. These embodiments of the APB of the package substrate enable (i) altering/increasing the high-frequency characteristic impedance to boost the launching energy of the high-frequency component to equalize the transmitted signal, and (ii) increasing the capacitive-coupling to the reference plane that enhances the crosstalk immunity. Additionally, the embodiments of the APBs described herein improve the eye opening of a TLINE by approximately 50% or greater—without increasing the overshoot/undershoot levels. For example, both ISI and crosstalk impacts may notably be addressed and improved with the APBs, where the first-half of the eye opening could be substantially pre-amplified by the APBs and helped to restore the collapsed eyes, and APBs' performance could be further ascertained by S-parameters result in term of insertion loss, NEXT and FEXT, where the APBs yield improved such result (as compared to existing TLINEs). Furthermore, in regards to the XY-area trade-offs, the embodiments described herein have the same routing pitch or even smaller routing pitch as compared to existing/conventional TLINE design. Furthermore, the APBs can restore the impedance of the existing TLINE within the same XY-footprint/trace width by approximately 10 ohm or greater, which is vital for the ever-narrowing/thinning of PCB designs.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having package substrates with TLINES that are disposed with one or more APBs below and/or above the TLINEs.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1 is an illustration of a perspective view of a package substrate 100 with a TLINE 105 having a plurality of conductive bumps 106 (or APBs) below the TLINE 105, according to one embodiment. In some embodiments, FIG. 1 illustrates one of the approaches that enables coupling the TLINE 105 and the conductive bumps 106 with a passive packaging solution by utilizing the transmission line skin-effect and transmission and self-coupling properties to transform the TLINE design/architecture to inherit the self-equalized and crosstalk-compensated properties. These embodiments of the package substrate 100 may be implemented by augmenting the transmission line 105 with the APBs 106 that are disposed (or coupled/merged) on the surfaces of the TLINE 105 using a via packaging patterning and electroplating process or the like.

Referring now to FIG. 1, a cross-sectional illustration of a package substrate 100 is shown, in accordance with an embodiment. In one embodiment, the package substrate 100 may include a conductive line 105. The conductive line 105 may be a transmission line (TLINE) that is used to transmit signals in the package substrate 100, such as a stripline, a microstrip, a dual-stripline, an embedded-microstrip, and/or the like. In some embodiments, the package substrate 100 may implement the transmission line 105 to be coupled with a plurality of conductive bumps 106.

For one embodiment, the package substrate 100 may include, but is not limited to, a package, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 130, where each dielectric layer can be a photosensitive dielectric layer. For one embodiment, the PCB 100 may include a plurality of conductive layers (e.g., a plurality of transmission lines 105, a reference conductive layer 103, etc.), which may further include copper (or metallic) traces, lines, pads, vias, via pads, holes, and/or planes.

The transmission line 105 may be formed of a conductive material (or a metallic material) such as copper, gold, or the like. For some embodiments, the transmission line 105 may be formed with one or more size parameters, including a width $T_{1W}$ and a thickness $T_{1T}$. In an embodiment, the transmission line 105 may be a rectangle conductor having a conductive layer 103 as a reference plane. The conductive layer 103 may be a reference conductive plane, a ground reference plane, an electrical reference plane, or the like. In one embodiment, a dielectric layers 130 may disposed between the transmission line 105 and the reference plane 103, where the dielectric layers 130 may surround the conductive bumps 106 and the bottom surface of the transmission line 105. Furthermore, a solder resist layer 131 may be disposed over the transmission line 105 and the dielectric layers 130, where the solder resist layer 131 may embed and surround the side walls and top surface of the transmission line 105. In an alternate embodiment, the conductive bumps 106 and the transmission line 105 may be embedded solely within the dielectric layers 130 or the solder resist layer 131; or the conductive bumps 106 and the transmission line 105 may be semi-embedded in both the dielectric layers 130 and the solder resist layer 131.

As described above, the APBs 106 may be conductive bumps that are periodically disposed on a surface of the transmission line 105. For example, as shown in FIG. 1, the conductive bumps 106 may be an array of periodic bumps that are coupled onto the bottom surface of the transmission line 105. The conductive bumps 106 may be disposed on a bottom surface, a top surface, or any other surfaces of the transmission line 105 (e.g., as shown below in FIGS. 2-4).

Additionally, the conductive bumps 106 may be formed of one or more conductive material (or a metallic material) such as copper, gold, or the like. In one embodiment, the conductive bumps 106 may have a metal conductivity that is the substantially equal to (or the same as) a metal conductivity of the transmission line 105. In another embodiment, the conductive bumps 106 may have a metal conductivity that is different than a metal conductivity of the transmission line 105. The metal conductivity materials of the conductive bumps 106 may be selected based on the optimum skin-depth corresponding to the desired equalization frequency range. In some embodiments, the conductive bumps 106 may be formed as one or more shapes in one or more orientations. The shapes of the conductive bumps 106 may include, but are not limited to, rectangles, squares, circles, diamonds, and polygons.

In some embodiments, each of the conductive bumps 106 may be formed with a desired area (or volume) (e.g., as shown with the one or more thicknesses "Txx" illustrated in FIG. 1), where the desired area is selected to optimize/improve the transmission line loss and crosstalk noise properties. For example, the conductive bumps 106 may be periodically patterned and disposed on the transmission line 106 to have or more size parameters, including a width $T_{2W}$, a thickness $T_{2T}$, a gap length $T_{2G}$ between the conductive bumps 106, and a length $T_{2L}$.

These size parameters combined with the metal conductivity of the conductive bumps 106 may be altered (or tuned) to optimize the skin depth, equalization effectiveness, and design of the transmission line 105. In an embodiment, the conductive bumps 106 may have a length $T_{2L}$ that is substantially less than a gap length $T_{2G}$ of the conductive bumps 106. Furthermore, the conductive bumps 106 may have a thickness $T_{2T}$ that is less than a thickness $T_{1T}$ of the transmission line 105. In other embodiments, the conductive bumps 106 may have a thickness $T_{2T}$ that is approximately equal to a thickness $T_{1T}$ of the transmission line 105. For one embodiment, the conductive bumps 106 may have a width $T_{2W}$ that is approximately equal to a width $T_{1W}$ of the transmission line 105. For example, in one embodiment, the transmission line 105 may have a width $T_{1W}$ that is approximately 15 um or less, and a thickness $T_{1T}$ that is approximately 10 um or less; while the conductive bumps 106 may have a width $T_{2W}$ that is approximately 15 um or less, a thickness $T_{2T}$ that is approximately 8 um or less (or 10 um or less), a gap length $T_{2G}$ that is approximately 80 um or less, and a length $T_{2L}$ that is approximately 15 um or less.

In the embodiments described herein, the conductive bumps 106 increase the high-frequency characteristic impedance of the transmission line 105 by increasing the self-inductance of the transmission line 105, which is implemented/realized by concentrating the high-frequency current into the tiny conductive bump structures with the corresponding skin-depth. The overall effect is therefore an increase in current density, which in turn increases the overall inductance of the transmission line 105 (or the transmission line design). For example, when the high-frequency characteristic impedance increases, the high-frequency transmission coefficient also increases, which thus allows higher launching voltage for the high-frequency component to create the equalization (pre-emphasis) effects.

Additionally, in these embodiments described herein, the conductive bumps 106 increase the capacitive-coupling of the transmission line 105 by reducing the effective distance to the reference plane 103, thereby making the electromagnetic field (EM-field) to be more confined and tightly coupled to the reference plane 103. The overall effect is thus less fringing of the EM-field to the adjacent transmission line (not shown), which then reduces the crosstalk of the transmission lines.

Accordingly, the package substrate 100 may implement a desired area combined with a desired metal conductivity of the conductive bumps 106 to facilitate the bandwidth-limitations of the transmission line 105 associated with ISI and crosstalk. The conductive bumps 106 therefore enable an improved TLINE architecture with pre-selected design dimensions, which provides a desired scaling/configuration of the TLINE 105 and respectively exhibits higher transmission bandwidth with enhanced noise immunity.

In this embodiment, the conductive bumps 106 enable the transmission line 105 to yield substantially improved results for the bandwidth-limitations of the transmission line 105 based on ISI and crosstalk (as compared to existing transmission line designs/configurations). For example, a 4 Gbps signal may be implemented with the conductive bumps 106 of the transmission line 105, where the transmission line 105 may be approximately a 10 mm on-package input/output (OPIO) interconnect/bus, thereby providing a voltage margin (or eye height) that may be approximately improved to 170 mV (e.g., as compared to using an existing TLINE with these same parameters having approximately a 105 mV voltage margin), a timing margin (or eye width) that may be approximately improved to 40 ps (e.g., as compared to using an existing TLINE with these same parameters having approximately a 33 ps timing margin), and an overshoot/undershoot voltage that may be negligible. Implementing the conductive bumps 106 also adequately enables implementing power and real-estate sensitive applications and low-power applications, while substantially reducing (i) the BOM and board design complexity, (ii) the physical layer (PHY) design complexity, (iii) the power requirements, and (iv) reliability issues that are typically associated with excessive signal overshoot/undershoot when transmission line is overdriven.

Note that the package substrate 100 may include fewer or additional packaging components based on the desired packaging design.

As described below in FIGS. 2-4, the conductive bumps (or APBs) may be disposed (or coupled/merged) onto several surfaces of the main transmission line (or TLINE) body to form various TLINE-APB configurations, including a package substrate 200 with the APBs 207 above the TLINE 205, a package substrate 300 with the APBs 306 and 307 symmetrically aligned (or disposed) below and above the TLINE 305, and a package substrate 400 with the APBs 406-409 asymmetrically aligned below and above the TLINE 405. Note that, as described above, the TLINE-APB configurations of the package substrates may include a single APB or a plurality of APBs having the same or different type of conductivity and thicknesses/skin-depths.

Figure 2:
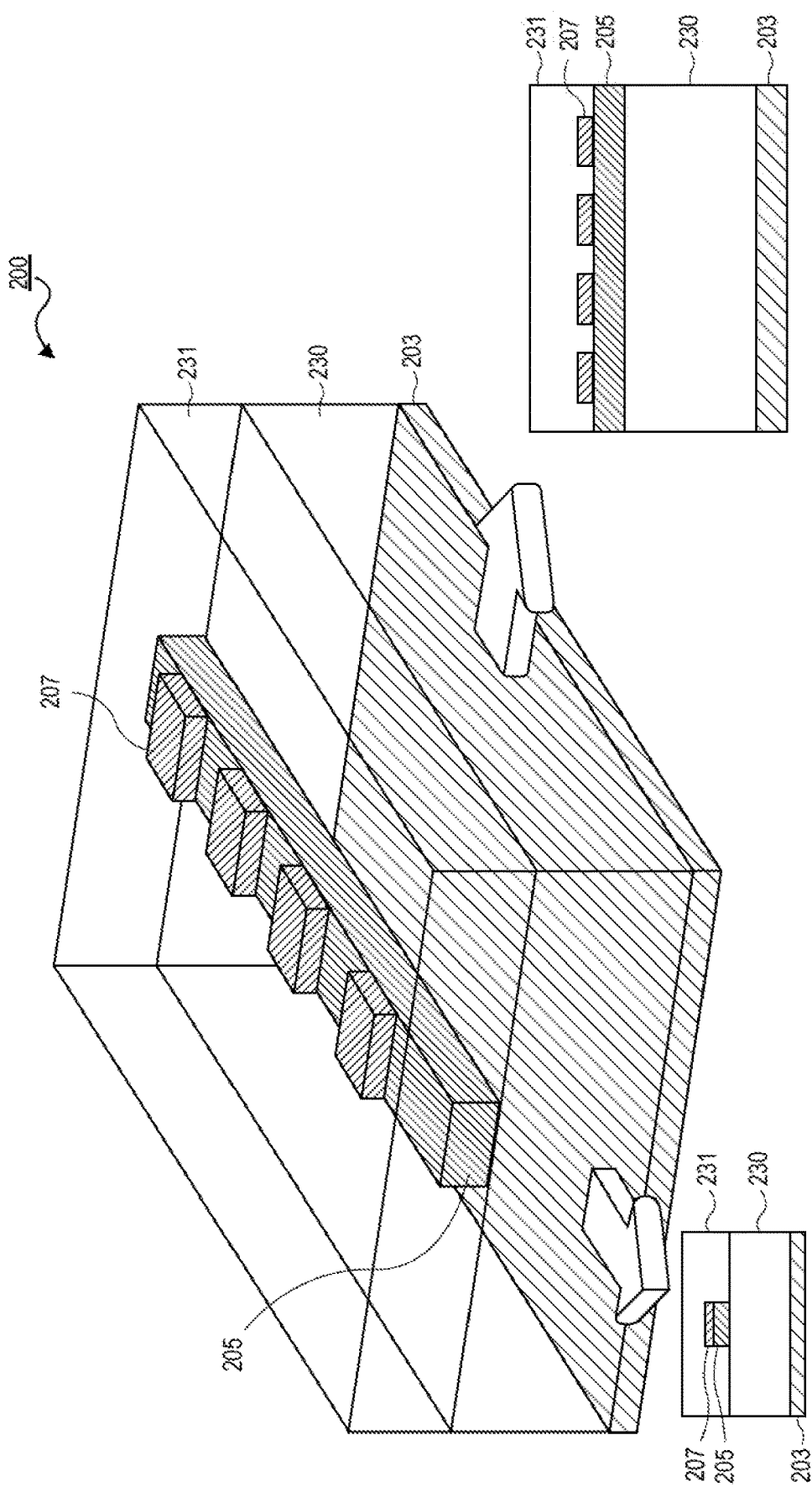
FIG. 2 is an illustration of a perspective view of a package substrate with a TLINE having an APB above the TLINE, according to one embodiment.

Referring now to FIG. 2, a cross-sectional illustration of a package substrate 200 is shown, in accordance with an embodiment. The semiconductor package 200 may be substantially similar to the package substrate 100 described above in FIG. 1, with the exception that the conductive bumps 207 are disposed above the transmission line 205, according to some embodiments. In one embodiment, the conductive bumps 207 are disposed on the top surface of the transmission line 205, where the conductive bumps 207 and the transmission line 205 may be disposed over the dielectric layers 230 and reference conductive layer 203, and the conductive bumps 207 and the transmission line 205 may be embedded/surrounded with the solder resist layer 231. The conductive bumps 207 of the transmission line 205 are substantially similar to the conductive bumps 106 of the transmission line 105 described above in FIG. 1.

Note that the semiconductor package 200 may include fewer or additional packaging components based on the desired packaging design.

Figure 3:
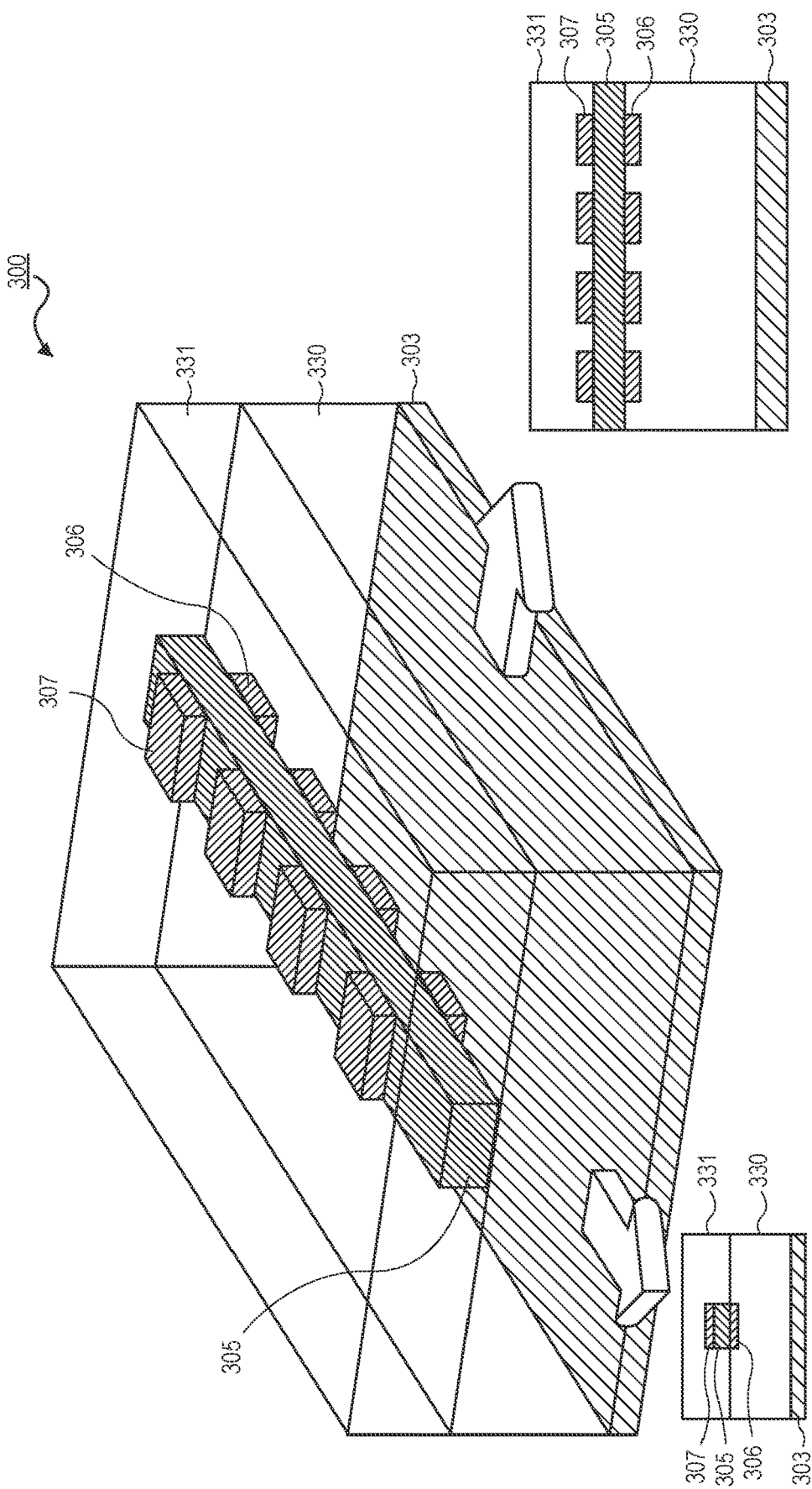
FIG. 3 is an illustration of a perspective view of a package substrate with a TLINE having APBs aligned/misaligned above and below the TLINE, according to one embodiment.

Referring now to FIG. 3, a cross-sectional illustration of a package substrate 300 is shown, in accordance with an embodiment. The semiconductor package 300 may be substantially similar to the package substrates 100 and 200 described above in FIGS. 1-2, with the exception that the conductive bumps 306 and 307 are disposed below and above the transmission line 305, according to some embodiments. In one embodiment, the conductive bumps 306 and 307 are patterned and disposed respectively on the bottom and top surfaces of the transmission line 305, where the conductive bumps 307 and the transmission line 305 may be disposed over the dielectric layers 330 and reference conductive layer 303, the conductive bumps 307 and the transmission line 305 may be embedded/surrounded with the solder resist layer 331, and the conductive bumps 306 may be embedded with the dielectric layers 330. In an embodiment, the conductive bumps 306 may be positioned (or aligned) on the transmission line 305 to be substantially symmetrical to the conductive bumps 307 on the transmission line 305.

In an embodiment, the conductive bumps 306 are symmetrically positioned below the transmission line 305 to be aligned with the conductive bumps 307 above the transmission line 305. In this embodiment, the symmetrically disposed conductive bumps 306-307 enable the transmission line 305 to yield substantially improved results for the bandwidth-limitations of the transmission line 305 based on ISI and crosstalk (as compared to existing transmission line designs/configurations). For example, a 4 Gbps signal may be implemented with the symmetrical top/bottom conductive bumps 306-307 of the transmission line 305, where the transmission line 305 may be approximately a 10 mm OPIO interconnect/bus, thereby providing a voltage margin that may be approximately improved to 200 mV (e.g., as compared to using an existing TLINE with these same parameters having approximately a 105 mV voltage margin), a timing margin that may be approximately improved to 41 ps (e.g., as compared to using an existing TLINE with these same parameters having approximately a 33 ps timing margin), and an overshoot/undershoot voltage that may be negligible.

The conductive bumps 306-307 of the transmission line 305 are substantially similar to the conductive bumps 106 of the transmission line 105 described above in FIG. 1. In some embodiments, the conductive bumps 306 may have a thickness that is substantially equal to a thickness of the conductive bumps 307. As described above, in some embodiments, the package substrate 300 may include the conductive bumps 306-307 having the same or different type of metal conductivity and thicknesses/skin-depths as the transmission line 305. Note that the semiconductor package 300 may include fewer or additional packaging components based on the desired packaging design.

Figure 4:
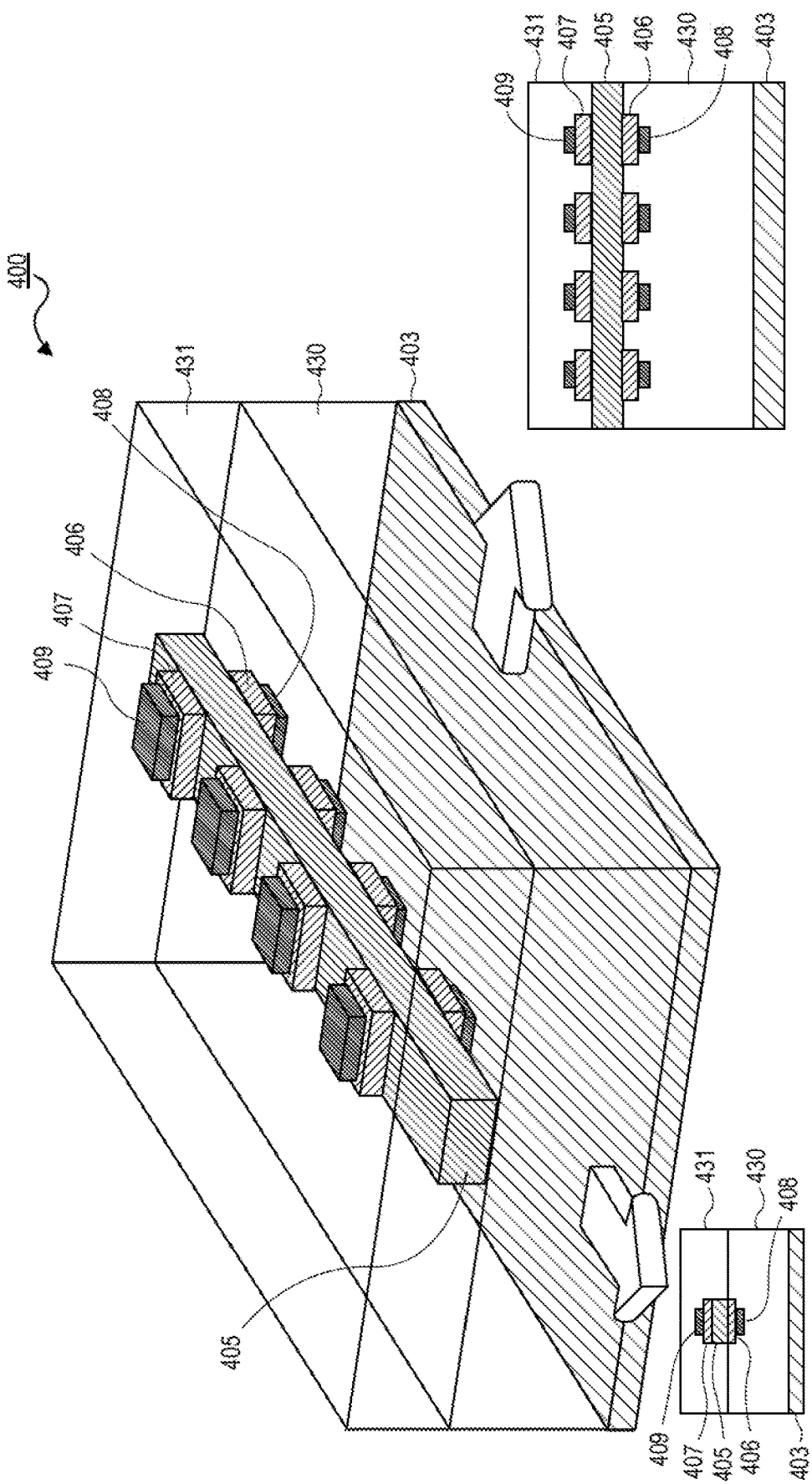
FIG. 4 is an illustration of a perspective view of a package substrate with a TLINE having two or more APBs aligned/misaligned above and below the TLINE, where the APBs above/below the TLINE have different thicknesses, according to one embodiment.

Referring now to FIG. 4, a cross-sectional illustration of a package substrate 400 is shown, in accordance with an embodiment. The semiconductor package 400 may be substantially similar to the package substrates 100, 200, and 300 described above in FIGS. 1-3, with the exception that the conductive bumps 406 and 408 are disposed below the transmission line 405, and the conductive bumps 407 and 409 are disposed above the transmission line 405, according to some embodiments. In one embodiment, the conductive bumps 406 and 408 are patterned and stacked on the bottom surface of the transmission line 405, while the conductive bumps 407 and 409 are patterned and stacked on the top surface of the transmission line 405. In one embodiment, the conductive bumps 407 and 409 and the transmission line 405 may be disposed over the dielectric layers 430, and may be embedded/surrounded with the solder resist layer 431. Additionally, the conductive bumps 406 and 408 may be embedded with the dielectric layers 430 and reference conductive layer 403. In an embodiment, the conductive bumps 406 and 408 may be positioned (or aligned) on the transmission line 405 to be substantially symmetrical to the conductive bumps 407 and 409 on the transmission line 405. However, in alternate embodiments, the conductive bumps 406 and 408 may be positioned (or aligned) asymmetrically on the transmission line 405 as compared to the conductive bumps 407 and 409 positioned/aligned on the transmission line 405.

The conductive bumps 406-409 of the transmission line 405 are substantially similar to the conductive bumps 106 of the transmission line 105 described above in FIG. 1. In some embodiments, the conductive bumps 406 may have a thickness that is substantially equal to a thickness of the conductive bumps 407. Likewise, in some embodiments, the conductive bumps 408 may have a thickness that is substantially equal to a thickness of the conductive bumps 409. In some embodiments, the conductive bumps 408-409 may have a thickness that is substantially equal to a thickness of the conductive bumps 406-407, while the conductive bumps 408-409 may have a length and/or a width that is/are different than a length and/or a width of the conductive bumps 406-407.

Additionally, the conductive bumps 408-409 may have a metal conductivity (or a plurality of conductive materials) that is different than a metal conductivity of the conductive bumps 406-407, where the metal conductivity of the conductive bumps 406-407 is the same for both conductive bumps 406-407. In other embodiments, the conductive bumps 406-407 may have the same metal conductivity, while the conductive bumps 408 may have a metal conductivity that is different than a metal conductivity of the conductive bumps 409. As described above, in some embodiments, the package substrate 400 may include one or more of the conductive bumps 406, 407, 408, and 409 having the same or different type of metal conductivity and thicknesses/skin-depths as the transmission line 405. Note that the semiconductor package 400 may include fewer or additional packaging components based on the desired packaging design.

Figure 5A:
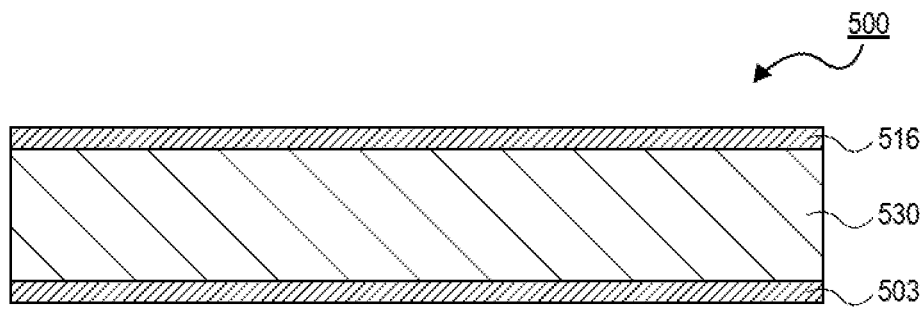
FIGS. 5A-5N are illustrations of cross-sectional views of a process flow to form a package substrate with a TLINE having an APB below/above the TLINE, according to some embodiments.
Figure 5B:
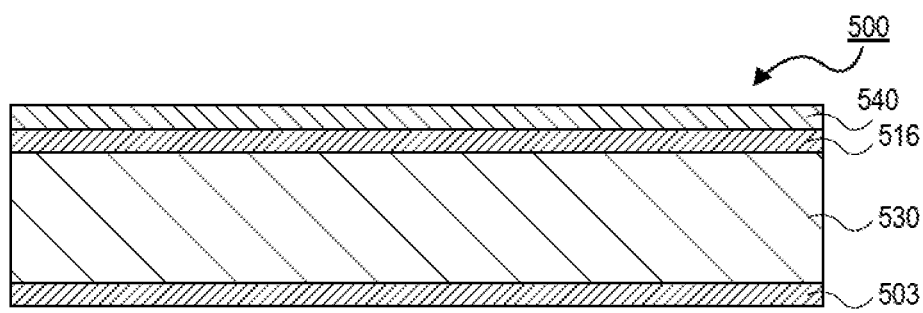
Figure 5C:
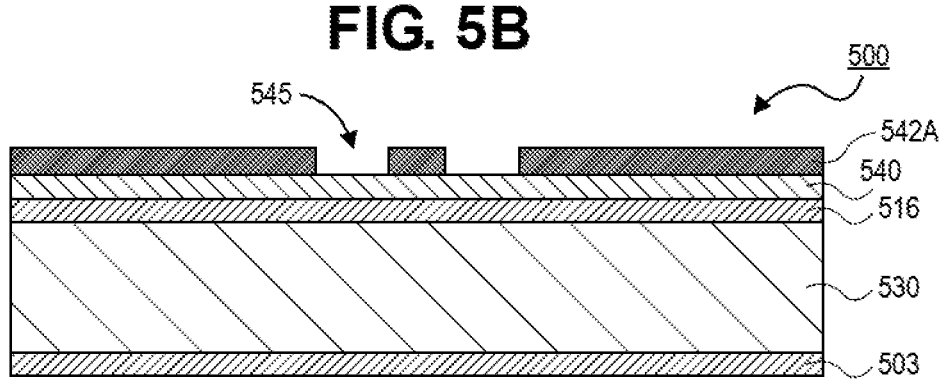
Figure 5D:
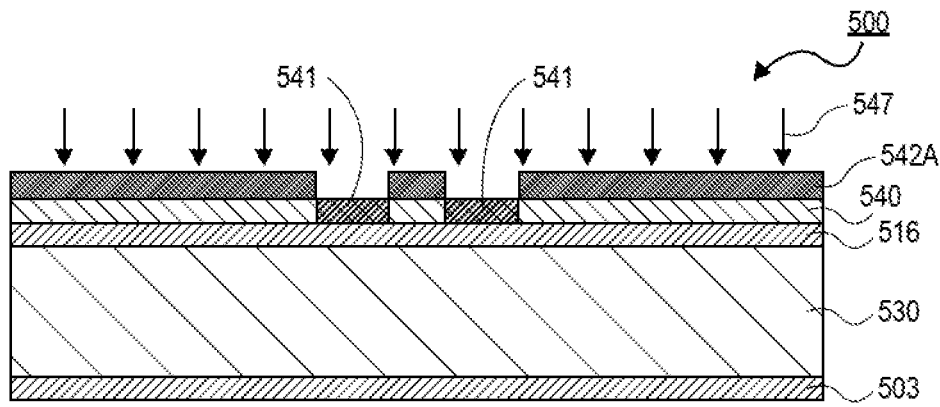
Figure 5E:
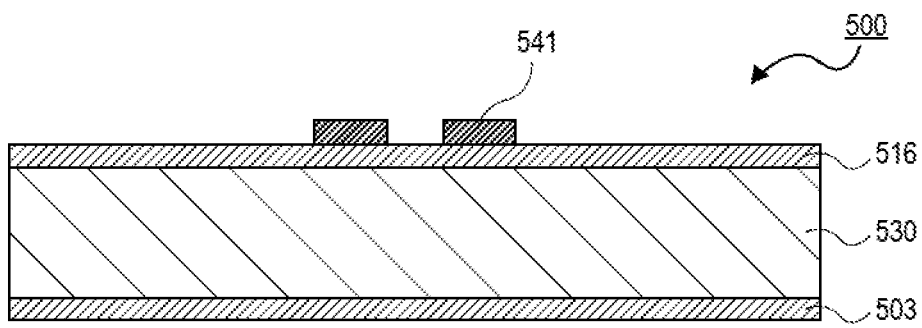
Figure 5F:
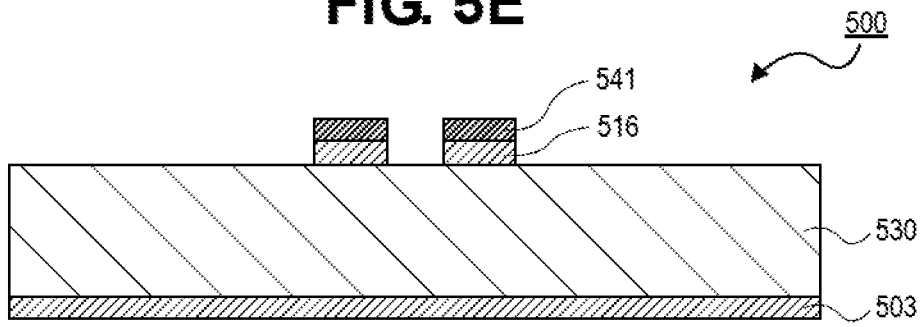
Figure 5G:
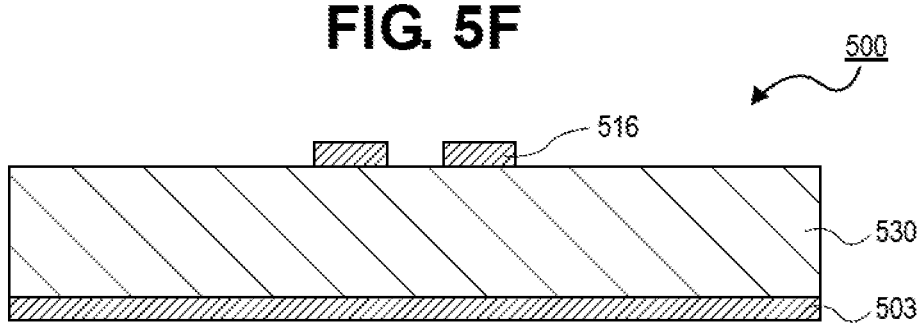
Figure 5H:
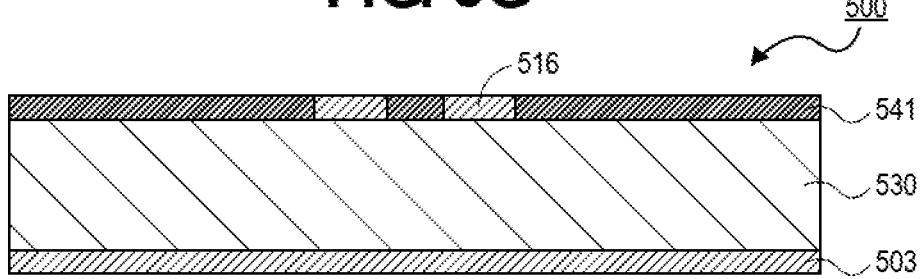
Figure 5I:
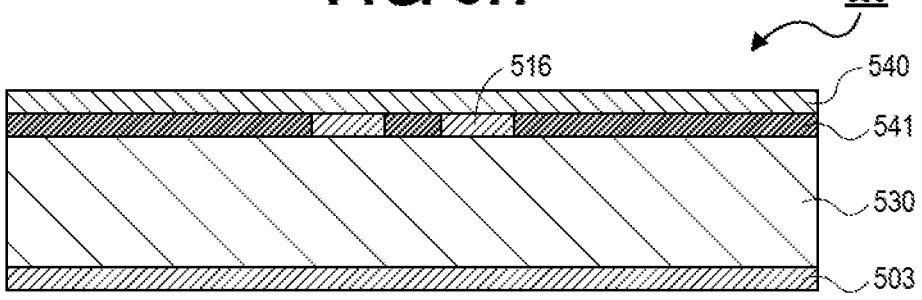
Figure 5J:
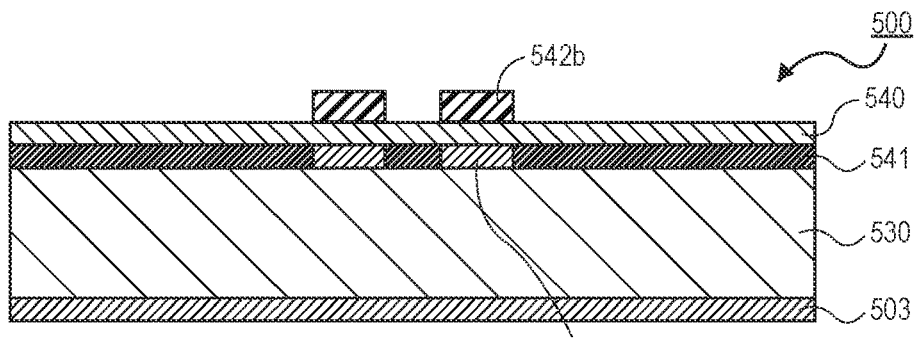
Figure 5K:
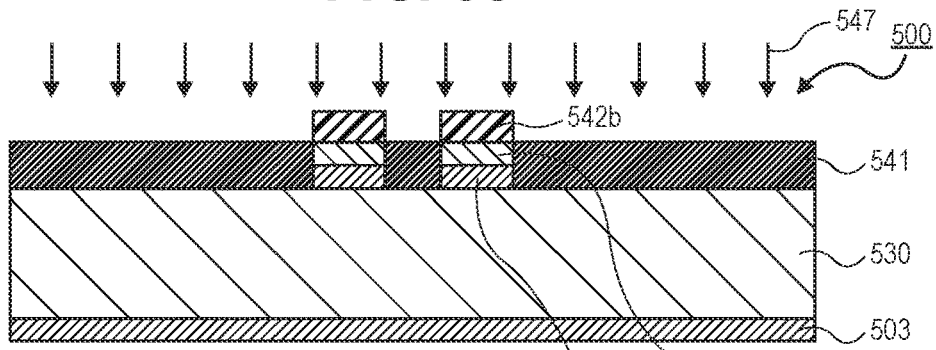
Figure 5L:
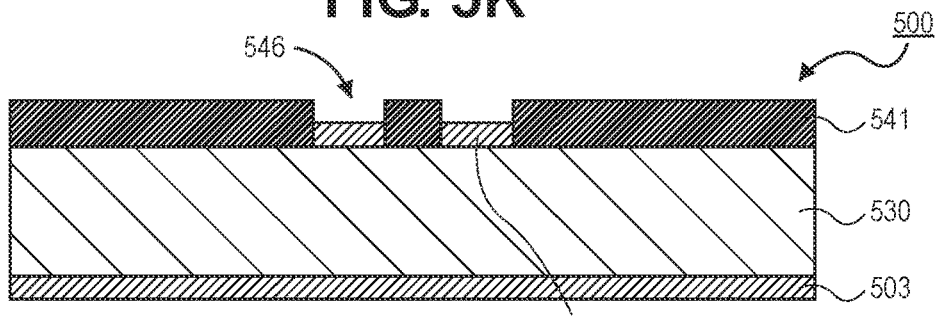
Figure 5M:
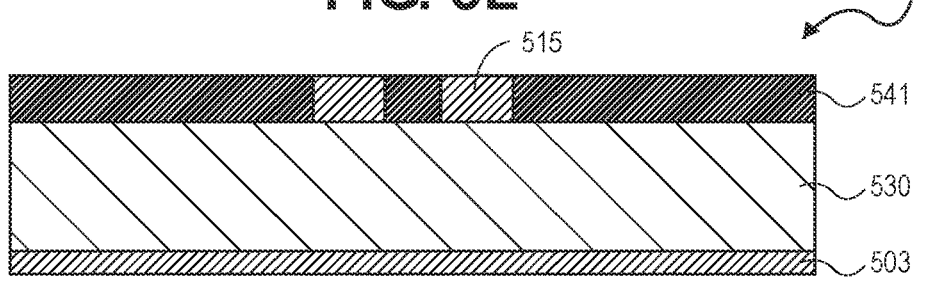
Figure 5N:
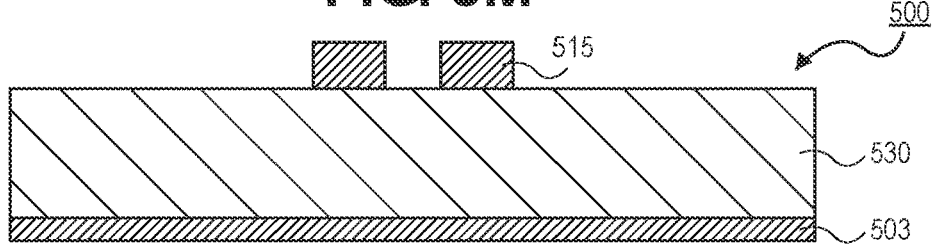

FIGS. 5A-5N are a series of cross-sectional illustrations that depict a package substrate 500 with a plurality of transmission lines 515 coupled/merged with conductive bumps, according to some embodiments. The process flow illustrated in FIGS. 5A-5N form the package substrate 500 that may be substantially similar to the package substrates 100, 200, 300, and 400 described above in FIGS. 1-4. Accordingly, as described above, this process flow of the package substrate 500 illustrates one of the approaches to pattern and dispose conductive material to form transmission lines 515 that are coupled/merged with conductive bumps as described herein, according to some embodiments.

Referring now to FIG. 5A, a cross-sectional illustration of a package substrate 500 is shown, in accordance with an embodiment. In an embodiment, the package substrate 500 may include a conductive layer 503, a dielectric layers 530, and a conductive layer 516. The conductive layer 516 may be disposed over the dielectric layers 530 and the conductive layer 503. In one embodiment, the conductive layer 503 may be a reference conductive plane such a ground plane or the like. For one embodiment, the conductive layers 503 and 516 may be formed of the same conductive (or metallic) materials, including copper or the like.

Referring now to FIG. 5B, a cross-sectional illustration of a package substrate 500 is shown, in accordance with an embodiment. In an embodiment, the package substrate 500 may include disposing a resist layer 540 on the conductive layer 516. For one embodiment, the resist layer 540 may be a photoresist layer such as a dry-film resist (DFR) layer. In some embodiments, the resist layer 540 may be implemented to form (or pattern) a conductive base layer of a conductive transmission line with conductive bumps (or a TLINE-APB as described herein) in a subsequent process described below.

Referring now to FIG. 5C, a cross-sectional illustration of a package substrate 500 is shown, in accordance with an embodiment. In an embodiment, the package substrate 500 may include disposing a patterned mask 542A over the resist layer 540 and the conductive layer 516. For one embodiment, the mask 542A may be patterned with openings 545 (or holes) that may expose one or more surfaces (or portions) of the resist layer 540. In some embodiments, the mask 542A may be disposed over the resist layer 540 to pattern the base layer of the transmission line in a subsequent process described below.

Referring now to FIG. 5D, a cross-sectional illustration of a package substrate 500 is shown, in accordance with an embodiment. In an embodiment, the package substrate 500 may include exposing the patterned mask 542A and the exposed surfaces of the resist layer 540 with a light source 547 (e.g., a laser direct imaging source, a ultra-violet (UV) light source, etc.). The laser 547 may be exposed through the openings of the patterned mask 542A and onto the exposed surfaces of the resist layer 540, where the exposed surfaces of the resist layer 540 may be hardened to form a plurality of hardened resist portions 541 by the laser 547. In one embodiment, the resist layer 540 may now include the hardened portions 541 over the conductive layer 516.

Referring now to FIG. 5E, a cross-sectional illustration of a package substrate 500 is shown, in accordance with an embodiment. In an embodiment, the package substrate 500 may include removing the resist layer as the hardened resist portions 541 remain patterned/disposed over the conductive layer 516. The resist layer may be removed with an etching process or the like to dissolve/etch (or remove) the unhardened portions of the resist layer.

Referring now to FIG. 5F, a cross-sectional illustration of a package substrate 500 is shown, in accordance with an embodiment. In an embodiment, the package substrate 500 may include removing the portions of the conductive layer 516 that are not covered with the hardened resist portions 541. The conductive layer may be removed with an etching process or the like to etch away (or remove) the exposed portions of the conductive layer as the covered conductive portions 516 remain covered with the hardened resist portions 541, and the remaining patterned hardened resist 541 and conductive portions 516 are both stacked over the dielectric layers 530.

Referring now to FIG. 5G, a cross-sectional illustration of a package substrate 500 is shown, in accordance with an embodiment. In an embodiment, the package substrate 500 may include removing (or stripping) the hardened resist portions 541 to expose the top surfaces of the conductive portions 516. The patterned conductive portions 516 may be implemented as the conductive base layer of the transmission lines (as described herein) that are formed using a subtractive plating process or the like.

Referring now to FIG. 5H, a cross-sectional illustration of a package substrate 500 is shown, in accordance with an embodiment. In an embodiment, the package substrate 500 may include disposing a hardened resist layer 541 over the dielectric layers 530, where the hardened resist layer 541 may surround the conductive portions 516. The hardened resist layer 541 may be formed using a similar process as illustrated in FIGS. 5B-5D (e.g., a resist layer may have direct UV exposure—without a mask—to form the hardened resist layer 541). In one embodiment, the hardened resist layer 541 may have a top surface that is substantially coplanar to the top surfaces of the conductive portions 516.

Referring now to FIG. 5I, a cross-sectional illustration of a package substrate 500 is shown, in accordance with an embodiment. In an embodiment, the package substrate 500 may include disposing a resist layer 540 over the hardened resist layer 541 and the conductive portions 516. The resist layer 540 may be an unhardened resist layer that is disposed over the hardened resist layer 541 and the conductive portions 516.

Referring now to FIG. 5J, a cross-sectional illustration of a package substrate 500 is shown, in accordance with an embodiment. In an embodiment, the package substrate 500 may include disposing a patterned mask 542b over the resist layer 540, the hardened resist layer 541, and the conductive portions 516. For one embodiment, the mask 542b may be patterned with openings that may expose one or more surfaces (or portions) of the resist layer 540. In some embodiments, the mask 542b may be disposed over the stack of resist layer 540 and conductive portions 516 to form a conductive top layer of the transmission line in a subsequent process described below. This conductive top layer may be subsequently disposed (or formed) to be implemented as the conductive bumps above the transmission line (e.g., as shown with the transmission line design of the conductive bumps 207 and the transmission line 205 of FIG. 2).

Referring now to FIG. 5K, a cross-sectional illustration of a package substrate 500 is shown, in accordance with an embodiment. In an embodiment, the package substrate 500 may include exposing the patterned mask 542b and the exposed surfaces of the resist layer 540 with a light source 547 as described above in FIG. 5D. The laser 547 may be exposed through the openings of the patterned mask 542b and onto the exposed surfaces of the resist layer 540, where the exposed surfaces of the resist layer 540 may be hardened to form a thicker hardened resist layer 541, while the unexposed surfaces of the resist layer (or the covered portions of the resist layer) may remain as unhardened resist portions directly over the conductive portions 516. In one embodiment, the resist layer may now include the unhardened resist portions 540 over the conductive portions 516.

Referring now to FIG. 5L, a cross-sectional illustration of a package substrate 500 is shown, in accordance with an embodiment. In an embodiment, the package substrate 500 may include removing the unhardened resist portions to expose openings 546 over the top surfaces of the conductive portions 516. The unhardened resist portions may be removed with an etching process or the like as described above. In one embodiment, the hardened resist layer 541 may now be patterned with the openings 546 that may be used to form a plurality of conductive bumps over the exposed top surfaces of the conductive portions 516, as shown in the subsequent steps below.

Referring now to FIG. 5M, a cross-sectional illustration of a package substrate 500 is shown, in accordance with an embodiment. In an embodiment, the package substrate 500 may include disposing (or depositing) a conductive material in the openings through the hardened resist layer 541, and over the exposed surfaces of the conductive portions 516 to form a plurality of conductive trench layers/formations. The conductive material may be disposed with an electrolytic plating process or the like. In one embodiment, the conductive material may now be implemented (or coupled/merged) to form a plurality of transmission lines 515 (i.e., the conductive base layer/portions) with the top conductive bumps (i.e., the conductive material disposed above for the trench/bump layers/formations).

Referring now to FIG. 5N, a cross-sectional illustration of a package substrate 500 is shown, in accordance with an embodiment. In an embodiment, the package substrate 500 may include removing (or stripping) the hardened resist portions to expose the combined conductive bumps and transmission lines 515 and the top surface of the dielectric layers 530. In one embodiment, as shown with FIGS. 5H-5N, the second plating process used to form these conductive bumps and transmission lines 515 may be a semi-additive plating (SAP) process or the like.

Note that the package substrate 500 as shown with FIGS. 5A-5N may include fewer or additional packaging components based on the desired packaging design.

Figure 6:
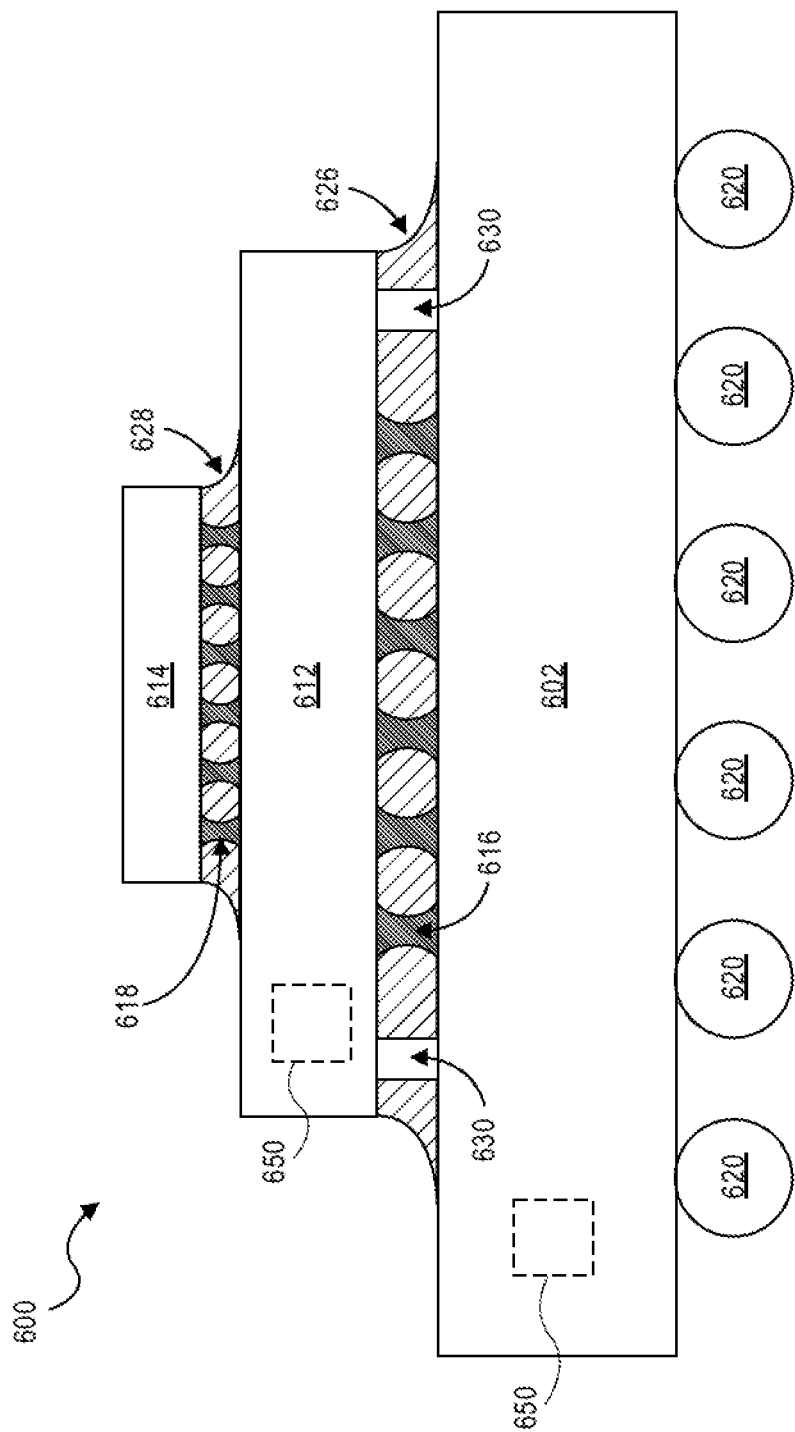
FIG. 6 is an illustration of a cross-sectional view of a semiconductor package with a die, an interposer, and a package substrate that include TLINEs with APBs below/above the TLINE, according to one embodiment.

FIG. 6 is an illustration of a cross-sectional view of a semiconductor packaged system 600 including a die 614, a substrate 612, a package substrate 602, and one or more build-up structures 650, according to one embodiment. FIG. 6 illustrates a semiconductor package 600 including a die 614, a substrate 612 (or an interposer), interconnect structures (e.g., the plurality of bumps disposed below the die 614 and the substrate 612), and the package substrate 602, where the substrate 612 and/or the package substrate 602 may include the transmission lines with conductive bumps (or TLINEAPB s) 650, according to some embodiments.

For one embodiment, the semiconductor package 600 may implement the substrate 612 and/or the package substrate 602 to include the TLINE-APBs 650 (as the transmission line/conductive bumps structures of the package substrates described herein). In one embodiment, the TLINE-APB(s) 650 of the substrate 612 and/or the package substrate 602 may be substantially similar to the TLINE-APB(s) of the package substrates 100, 200, 300, 400, and 500 described above in FIGS. 1-5. Note that the semiconductor package 600 is not limited to the illustrated semiconductor packaged system, and thus may be designed/formed with fewer, alternate, or additional packaging components and/or with different interconnecting structures.

According to one embodiment, the semiconductor package 600 is merely one example of an embodiment of a semiconductor packaged system. For one embodiment, the semiconductor package 600 may include a ball grid array (BGA) package, a land grid array (LGA) package, and/or a pin grid array (PGA) package. For one embodiment, a die 614 is coupled to a substrate 612 (e.g., an interposer) via one or more bumps/joints formed from respective microbumps.

As described above, a solder joint formed by soldering of a microbump according to an embodiment may itself be referred to as a "bump" and/or a "microbump." Additionally, for other embodiments, the die 614, the substrate 612, and the package substrate 602 may be coupled using anisotropic conductive film (ACF). For one embodiment, the substrate 612 may be, but is not limited to, a silicon interposer and/or a die with through silicon vias (TSVs). For an alternate embodiment, the semiconductor package 600 may omit the interposer/substrate 612.

For some embodiments, the semiconductor package 600 may have the die 614 disposed on the interposer 612, where both the stacked die 614 and interposer 612 are disposed on a package substrate 602. According to some embodiments, the package substrate 602 may include, but is not limited to, a package, a substrate, a PCB, and a motherboard. For one embodiment, the package substrate 602 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 602 may also include conductive layers that comprise copper lines/traces, metallic pads, vias, via pads, planes, and/or holes.

For one embodiment, the die 614 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 614 may be formed from a material such as silicon and have circuitry thereon that is to be coupled to the interposer 612. Although some embodiments are not limited in this regard, the package substrate 602 may in turn be coupled to another body, for example, a computer motherboard. One or more connections between the package substrate 602, the interposer 612, and the die 614—e.g., including some or all of bumps 616, 618, and 620—may include one or more interconnect structures and underfill layers 626 and 628. In some embodiments, these interconnect structures (or connections) may variously comprise an alloy of nickel, palladium, and tin (and, in some embodiments, Cu).

Connections between the package substrate 602 and another body may be made using any suitable structure, such as the illustrative bumps 620 shown. The package substrate 602 may include a variety of electronic structures formed thereon or therein. The interposer 612 may also include electronic structures formed thereon or therein, which may be used to couple the die 614 to the package substrate 602. For one embodiment, one or more different materials may be used for forming the package substrate 602 and the interposer 612. In certain embodiments, the package substrate 602 is an organic substrate made up of one or more layers of polymer base material, with conducting regions for transmitting signals. In certain embodiments, the interposer 612 is made up of a ceramic base material including metal regions for transmitting signals. Although some embodiments are not limited in this regard, the semiconductor package 600 may include gap control structures 630—e.g., positioned between the package substrate 602 and the interposer 612. Such gap control structures 630 may mitigate a change in the height of the gap between the package substrate 602 and the interposer 612, which otherwise might occur during reflowing while die 614 is attached to interposer 612. Note that the semiconductor package 600 includes an underfill material 628 between the interposer 612 and the die 614, and an underfill material 626 between the package substrate 602 and the interposer 612. For one embodiment, the underfill materials (or layers) 626 and 628 may be one or more polymers that are injected between the layers. For other embodiments, the underfill materials may be molded underfills (MUF).

Note that the semiconductor package 600 may include fewer or additional packaging components based on the desired packaging design.

Figure 7:
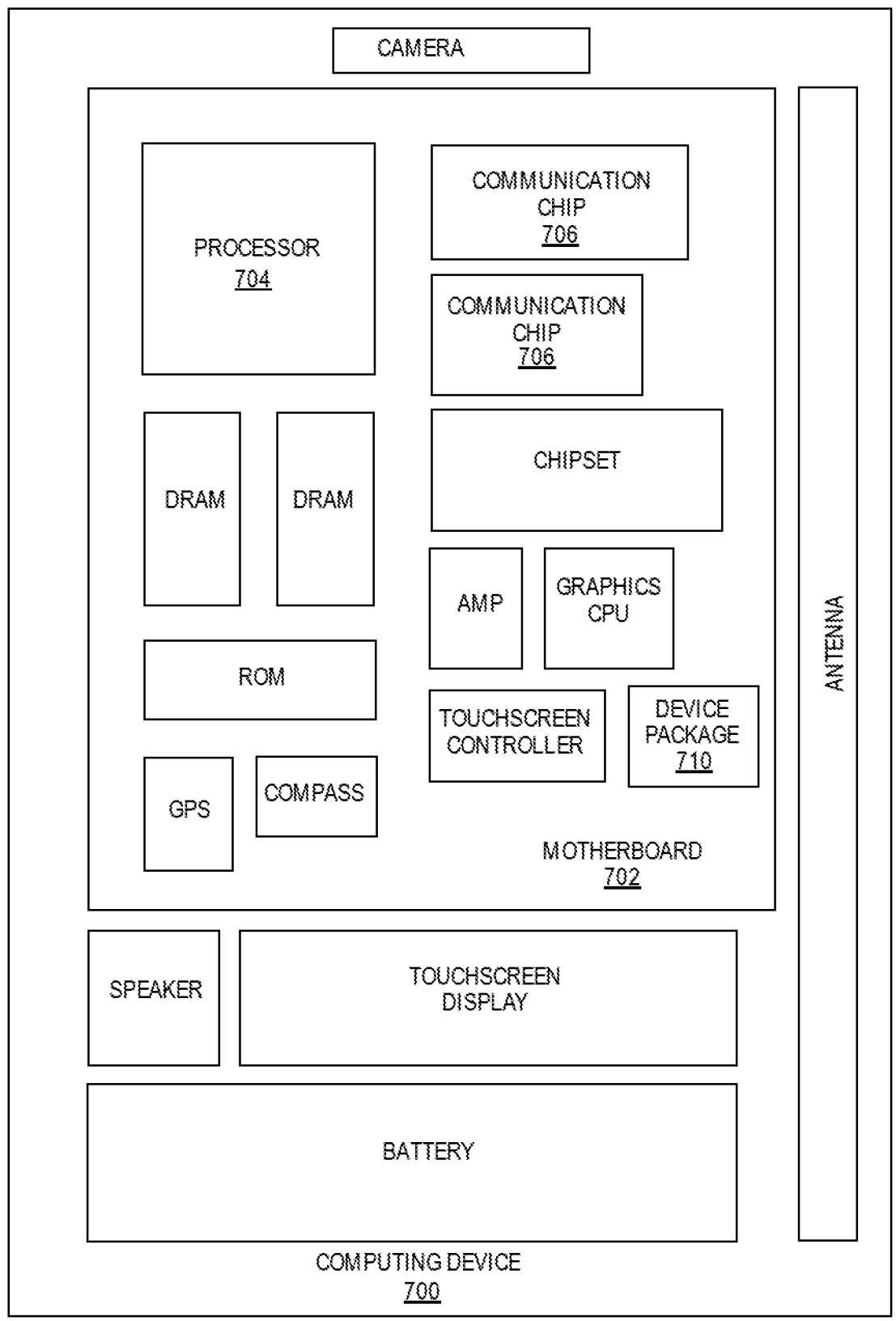
FIG. 7 is an illustration of a schematic block diagram illustrating a computer system that utilizes a device package with a package substrate that includes TLINEs having APBs below/above the TLINEs, according to one embodiment.

FIG. 7 is an illustration of a schematic block diagram illustrating a computer system 700 that utilizes a device package 710 (or a semiconductor package) with a package substrate having TLINEs with APBs below/above the TLINE, according to one embodiment. FIG. 7 illustrates an example of computing device 700. Computing device 700 houses motherboard 702. Motherboard 702 may include a number of components, including but not limited to processor 704, device package 710 (or semiconductor package), and at least one communication chip 706. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be, but is not limited to, a substrate, a package substrate, and/or a PCB. In one embodiment, device package 710 may be a package substrate as described herein. Device package 710 may include a package substrate having transmission lines with conductive bumps (or stacked conductive bumps) disposed below and/or above the transmission lines (e.g., as illustrated and described above in FIGS. 1-5)—or any other components from the figures described herein.

Note that device package 710 may be a single component/device, a subset of components, and/or an entire system, as the materials, features, and components may be limited to device package 710 and/or any other component of the computing device 700 that may have transmission lines with conductive bumps on the top surfaces, bottom surfaces, and/or both top/bottom surfaces (e.g., the motherboard 702, the processor 704, and/or any other component of the computing device 700 that may need the embodiments of the package substrates as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a dielectric over a conductive layer; a conductive line on the dielectric; a plurality of conductive bumps on a surface of the conductive line, wherein the plurality of conductive bumps are conductively coupled to the conductive line; and a solder resist over the conductive line and the dielectric.

In example 2, the subject matter of example 1 can optionally include that the surface of the conductive line is a bottom surface, wherein the plurality of conductive bumps are below the conductive line and conductively coupled to the bottom surface of the conductive line, and wherein the plurality of conductive bumps are embedded in the dielectric.

In example 3, the subject matter of examples 1-2 can optionally include that the surface of the conductive line is a top surface, wherein the plurality of conductive bumps are above the conductive line and conductively coupled to the top surface of the conductive line, and wherein the plurality of conductive bumps are embedded in the solder resist.

In example 4, the subject matter of examples 1-3 can optionally include that the conductive line is a transmission line, and wherein the conductive layer is a conductive reference plane.

In example 5, the subject matter of example 4 can optionally include that the transmission line is a stripline, a microstrip, a dual-stripline, or an embedded-microstrip.

In example 6, the subject matter of examples 1-5 can optionally include that the plurality of conductive bumps have one or more shapes, and wherein the one or more shapes include rectangles, squares, circles, diamonds, or polygons, and wherein the plurality of conductive bumps have a width that is equal to a width of the conductive line.

In example 7, the subject matter of examples 1-6 can optionally include that the conductive line includes a conductive material that is equal to a conductive material of the plurality of conductive bumps.

In example 8, the subject matter of examples 1-7 can optionally include that the conductive line includes a thickness that is substantially equal to a thickness of the plurality of conductive bumps, or wherein the conductive line includes a thickness that is greater than a thickness of the plurality of conductive bumps.

In example 9, the subject matter of examples 1-8 can optionally include that the plurality of conductive bumps have a first conductive bump and a second conductive bump, wherein the first conductive bump and the second conductive bump have a length, wherein the first conductive bump and the second conductive bump are separated by a gap length, and wherein the length is less than the gap length between the first and second conductive bumps.

Example 10 is a package substrate, comprising: a dielectric over a conductive layer; a conductive line on the dielectric; a plurality of first conductive bumps on a top surface of the conductive line; a plurality of second conductive bumps on a bottom surface of the conductive line, wherein the plurality of first and second conductive bumps are conductively coupled to the conductive line; and a solder resist over the plurality of first conductive bumps, the conductive line, and the dielectric.

In example 11, the subject matter of example 10 can optionally include that the plurality of first conductive bumps are symmetrically positioned over the plurality of second conductive bumps.

In example 12, the subject matter of examples 10-11 can optionally include that the plurality of first conductive bumps are above the conductive line and conductively coupled to the top surface of the conductive line, wherein the plurality of second conductive bumps are below the conductive line and conductively coupled to the bottom surface of the conductive line, wherein the plurality of first conductive bumps are embedded in the solder resist, and wherein the plurality of second conductive bumps are embedded in the dielectric.

In example 13, the subject matter of examples 10-12 can optionally include that the conductive line is a transmission line, and wherein the conductive layer is a conductive reference plane.

In example 14, the subject matter of example 13 can optionally include that the transmission line is a stripline, a microstrip, a dual-stripline, or an embedded-microstrip.

In example 15, the subject matter of examples 10-14 can optionally include that the plurality of first and second conductive bumps have one or more shapes, and wherein the one or more shapes include rectangles, squares, circles, diamonds, or polygons, and wherein the plurality of first and second conductive bumps have a width that is equal to a width of the conductive line.

In example 16, the subject matter of examples 10-15 can optionally include that the conductive line includes a conductive material that is equal to a conductive material of the plurality of first and second conductive bumps.

In example 17, the subject matter of examples 10-16 can optionally include that the plurality of first conductive bumps have a thickness that is substantially equal to a thickness of the plurality of second conductive bumps, or wherein the plurality of first conductive bumps have a thickness that is different than a thickness of the plurality of second conductive bumps.

In example 18, the subject matter of example 17 can optionally include that the conductive line includes a thickness that is substantially equal to the thickness of the plurality of first and second conductive bumps, or wherein the conductive line includes a thickness that is greater than the thickness of the plurality of first and second conductive bumps.

In example 19, the subject matter of examples 10-18 can optionally include that the plurality of first and second conductive bumps have a first conductive bump and a second conductive bump, wherein the first conductive bump and the second conductive bump have a length, wherein the first conductive bump and the second conductive bump are separated by a gap length, and wherein the length is less than the gap length between the first and second conductive bumps.

Example 20 is a package substrate, comprising: a dielectric over a conductive layer; a conductive line on the dielectric; a plurality of first conductive bumps on a top surface of the conductive line; a plurality of second conductive bumps on a bottom surface of the conductive line; a plurality of third conductive bumps on the first conductive bumps, wherein the plurality of first and third conductive bumps are stacked above the conductive line; a plurality of fourth conductive bumps on the second conductive bumps, wherein the plurality of second and fourth conductive bumps are stacked below the conductive line, and wherein the plurality of first, second, third and fourth conductive bumps are conductively coupled to the conductive line; and a solder resist over the plurality of first and third conductive bumps, the conductive line, and the dielectric.

In example 21, the subject matter of example 20 can optionally include that the plurality of first and third conductive bumps are symmetrically positioned over the plurality of second and fourth conductive bumps, wherein the plurality of first conductive bumps are above the conductive line and conductively coupled to the top surface of the conductive line, wherein the plurality of second conductive bumps are below the conductive line and conductively coupled to the bottom surface of the conductive line, wherein the plurality of first and third conductive bumps are embedded in the solder resist, wherein the plurality of second and fourth conductive bumps are embedded in the dielectric, wherein the conductive line is a transmission line, and wherein the conductive layer is a conductive reference plane, and wherein the transmission line is a stripline, a microstrip, a dual-stripline, or an embedded-microstrip.

In example 22, the subject matter of examples 20-21 can optionally include that the plurality of first, second, third and fourth conductive bumps have one or more shapes, and wherein the one or more shapes include rectangles, squares, circles, diamonds, or polygons, wherein the plurality of first and second conductive bumps have a width that is equal to a width of the conductive line, wherein the plurality of third and fourth conductive bumps have a width that is less than the width of the conductive line and the width of the plurality of first and second conductive bumps, wherein the conductive line includes a conductive material that is equal to a conductive material of the plurality of first and second conductive bumps, and wherein the conductive line includes the conductive material that is the equal to or different than a conductive material of the plurality of third and fourth conductive bumps.

In example 23, the subject matter of examples 20-22 can optionally include that the plurality of first conductive bumps have a thickness that is substantially equal to a thickness of the plurality of second conductive bumps, or wherein the plurality of first conductive bumps have a thickness that is different than a thickness of the plurality of second conductive bumps.

In example 24, the subject matter of examples 20-23 can optionally include that the conductive line includes a thickness that is substantially equal to the thickness of the plurality of first and second conductive bumps, or wherein the conductive line includes a thickness that is greater than the thickness of the plurality of first and second conductive bumps.

In example 25, the subject matter of example 24 can optionally include that the plurality of first and second conductive bumps have the thickness that is different than a thickness of the plurality of third and fourth conductive bumps, wherein the plurality of first and second conductive bumps have a first conductive bump and a second conductive bump, wherein the first conductive bump and the second conductive bump have a length, wherein the first conductive bump and the second conductive bump are separated by a gap length, and wherein the length is less than the gap length between the first and second conductive bumps.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
    a dielectric over a conductive layer;
    a conductive line on the dielectric;
    a plurality of conductive bumps on a surface of the conductive line, wherein the plurality of conductive bumps are conductively coupled to the conductive line and are embedded in the dielectric;
    a plurality of metal features on the plurality of conductive bumps, wherein individual ones of the plurality of metal features are on a corresponding individual one of the plurality of conductive bumps, and wherein the plurality of metal features has a metal conductivity different than that of the plurality of conductive bumps; and
    a solder resist over the conductive line and the dielectric.

2. The package substrate of claim 1, wherein the surface of the conductive line is a bottom surface, wherein the plurality of conductive bumps are below the conductive line and conductively coupled to the bottom surface of the conductive line.

3. The package substrate of claim 1, wherein the conductive line is a transmission line, and wherein the conductive layer is a conductive reference plane.

4. The package substrate of claim 3, wherein the transmission line is a stripline, a microstrip, a dual-stripline, or an embedded-microstrip.

5. The package substrate of claim 1, wherein the plurality of conductive bumps have one or more shapes, and wherein the one or more shapes include rectangles, squares, circles, diamonds, or polygons, and wherein the plurality of conductive bumps have a width that is equal to a width of the conductive line.

6. The package substrate of claim 1, wherein the conductive line includes a conductive material that is the same as a conductive material of the plurality of conductive bumps.

7. The package substrate of claim 1, wherein the conductive line includes a thickness that is substantially equal to a thickness of the plurality of conductive bumps, or wherein the conductive line includes a thickness that is greater than a thickness of the plurality of conductive bumps.

8. The package substrate of claim 1, wherein the plurality of conductive bumps have a first conductive bump and a second conductive bump, wherein the first conductive bump and the second conductive bump have a length, wherein the first conductive bump and the second conductive bump are separated by a gap length, and wherein the length is less than the gap length between the first and second conductive bumps.

9. A package substrate, comprising:
    a dielectric over a conductive layer;
    a conductive line on the dielectric;
    a plurality of first conductive bumps on a top surface of the conductive line;
    a plurality of first metal features on the plurality of first conductive bumps, wherein individual ones of the plurality of first metal features are on a corresponding individual one of the plurality of first conductive bumps, and wherein the plurality of first metal features has a metal conductivity different than that of the plurality of first conductive bumps;
    a plurality of second conductive bumps on a bottom surface of the conductive line, wherein the plurality of first and second conductive bumps are conductively coupled to the conductive line, and wherein the plurality of second conductive bumps is embedded in the dielectric;
    a plurality of second metal features on the plurality of second conductive bumps, wherein individual ones of the plurality of second metal features are on a corresponding individual one of the plurality of second conductive bumps, and wherein the plurality of second metal features has a metal conductivity different than that of the plurality of second conductive bumps; and
    a solder resist over the plurality of first conductive bumps, the conductive line, and the dielectric.

10. The package substrate of claim 9, wherein the plurality of first conductive bumps are symmetrically positioned over the plurality of second conductive bumps.

11. The package substrate of claim 9, wherein the plurality of first conductive bumps are conductively coupled to the top surface of the conductive line, wherein the plurality of second conductive bumps are conductively coupled to the bottom surface of the conductive line, wherein the plurality of first conductive bumps are embedded in the solder resist.

12. The package substrate of claim 9, wherein the conductive line is a transmission line, and wherein the conductive layer is a conductive reference plane.

13. The package substrate of claim 12, wherein the transmission line is a stripline, a microstrip, a dual-stripline, or an embedded-microstrip.

14. The package substrate of claim 9, wherein the plurality of first and second conductive bumps have one or more shapes, and wherein the one or more shapes include rectangles, squares, circles, diamonds, or polygons, and wherein the plurality of first and second conductive bumps have a width that is equal to a width of the conductive line.

15. The package substrate of claim 9, wherein the conductive line includes a conductive material that is the same as a conductive material of the plurality of first and second conductive bumps.

16. The package substrate of claim 9, wherein the plurality of first conductive bumps have a thickness that is substantially equal to a thickness of the plurality of second conductive bumps, or wherein the plurality of first conductive bumps have a thickness that is different than a thickness of the plurality of second conductive bumps.

17. The package substrate of claim 16, wherein the conductive line includes a thickness that is substantially equal to the thickness of the plurality of first and second conductive bumps, or wherein the conductive line includes a thickness that is greater than the thickness of the plurality of first and second conductive bumps.

\* \* \* \* \*